(12) United States Patent
Hirota et al.

(10) Patent No.: US 10,777,596 B2
(45) Date of Patent: Sep. 15, 2020

(54) IMAGING APPARATUS, METHOD OF MANUFACTURING THE SAME, AND DEVICE

(71) Applicant: CANON KABUSHIKI KAISHA, Tokyo (JP)

(72) Inventors: Katsunori Hirota, Yamato (JP); Keiichi Sasaki, Yokohama (JP); Tsutomu Tange, Yokohama (JP); Yoshiei Tanaka, Hachioji (JP); Akira Ohtani, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 118 days.

(21) Appl. No.: 16/137,861

(22) Filed: Sep. 21, 2018

(65) Prior Publication Data

US 2019/0096946 A1 Mar. 28, 2019

(30) Foreign Application Priority Data

Sep. 28, 2017 (JP) .................................. 2017-188985

(51) Int. Cl.
| | |
|---|---|
| *H01L 27/146* | (2006.01) |
| *H01L 31/103* | (2006.01) |
| *H01L 29/423* | (2006.01) |
| *H01L 29/51* | (2006.01) |
| *H01L 29/778* | (2006.01) |
| *H01L 29/20* | (2006.01) |
| *H01L 29/66* | (2006.01) |
| *H01L 29/78* | (2006.01) |

(52) U.S. Cl.
CPC .... *H01L 27/14629* (2013.01); *H01L 27/1462* (2013.01); *H01L 27/14612* (2013.01); *H01L 27/14627* (2013.01); *H01L 27/14685* (2013.01); *H01L 27/14687* (2013.01); *H01L 27/14689* (2013.01); *H01L 29/2003* (2013.01); *H01L 29/42376* (2013.01); *H01L 29/518* (2013.01); *H01L 29/66462* (2013.01); *H01L 29/7787* (2013.01); *H01L 29/7833* (2013.01); *H01L 31/103* (2013.01)

(58) Field of Classification Search
CPC .................................................. H01L 27/14629
USPC ............................................................ 438/2
See application file for complete search history.

(56) References Cited

U.S. PATENT DOCUMENTS 8,982,254 B2  3/2015  Shoyama
9,893,114 B2 * 2/2018  Endo ................. H01L 27/14685
(Continued)

FOREIGN PATENT DOCUMENTS

| JP | 9-92813 A | 4/1997 |
|---|---|---|
| JP | 11-330443 A | 11/1999 |

(Continued)

OTHER PUBLICATIONS

Suzuki et al., U.S. Appl. No. 16/275,652, filed Feb. 14, 2019.

*Primary Examiner* — Jami Valentine Miller
(74) *Attorney, Agent, or Firm* — Venable LLP

(57) ABSTRACT

An imaging apparatus includes a substrate including a photoelectric conversion portion; and a silicon nitride layer arranged to cover at least a portion of the photoelectric conversion portion. The silicon nitride layer contains chlorine. An N/Si composition ratio in the silicon nitride layer is not less than 1.00 and is less than 1.33.

20 Claims, 8 Drawing Sheets

(56) References Cited

U.S. PATENT DOCUMENTS

| | | | | |
|---|---|---|---|---|
| 2011/0175187 A1* | 7/2011 | Ueno | ............... | H01L 27/1462 |
| | | | | 257/437 |
| 2013/0087838 A1* | 4/2013 | Mishima | ............ | H01L 27/1462 |
| | | | | 257/291 |
| 2014/0284613 A1 | 9/2014 | Kuraguchi et al. | | |
| 2015/0104954 A1 | 4/2015 | Pore | | |
| 2018/0070041 A1* | 3/2018 | Hirota | ............... | H01L 27/1463 |
| 2019/0280023 A1* | 9/2019 | Suzuki | ............... | H01L 27/1462 |

FOREIGN PATENT DOCUMENTS

| | | | |
|---|---|---|---|
| JP | 2011-014673 A | 1/2011 |
| JP | 2013-84693 A | 5/2013 |
| JP | 2014-187084 A | 10/2014 |

\* cited by examiner

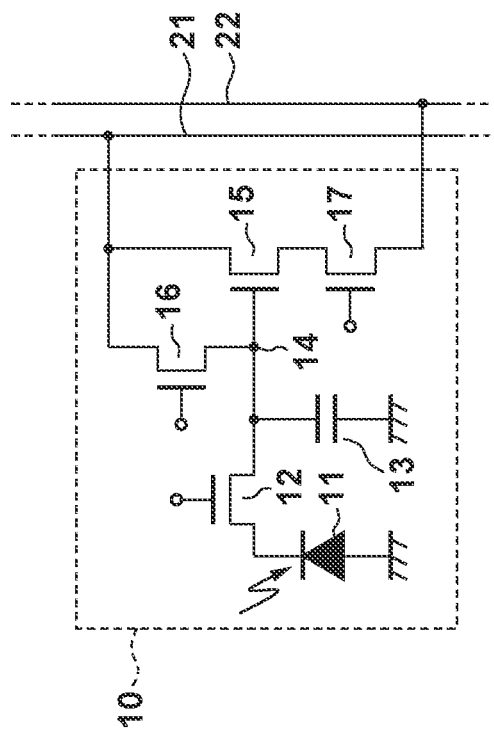
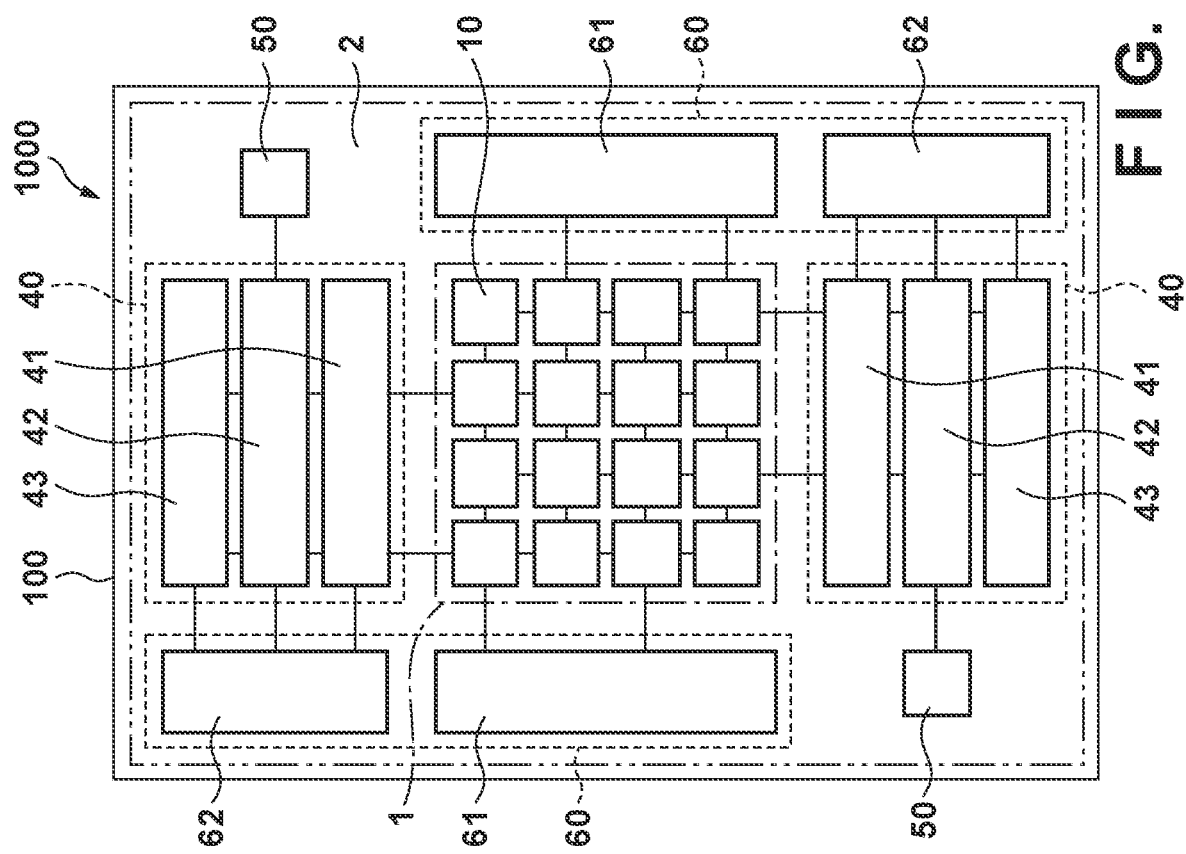

F I G. 6A
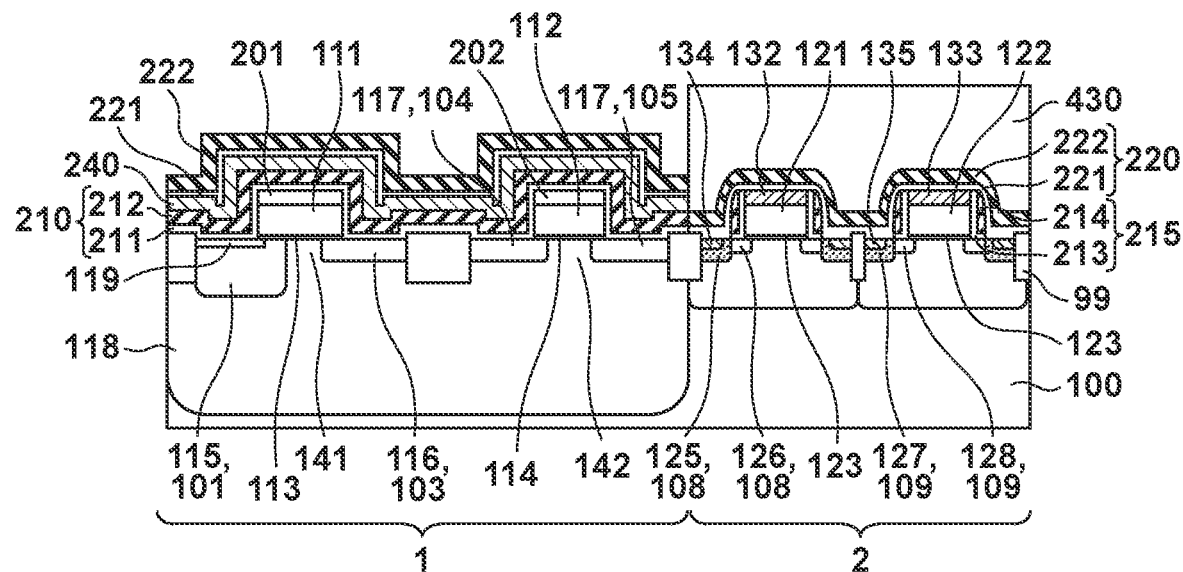
F I G. 6B
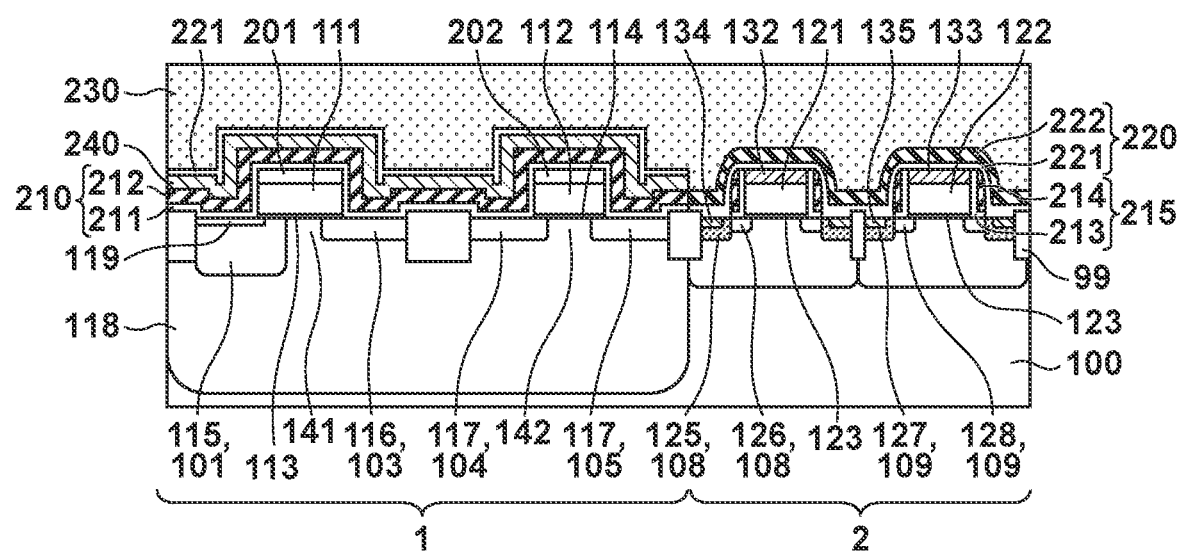

IMAGING APPARATUS, METHOD OF MANUFACTURING THE SAME, AND DEVICE

BACKGROUND OF THE INVENTION

Field of the Invention

The present invention relates to an imaging apparatus, a method of manufacturing the same, and a device.

Description of the Related Art

A method of forming silicon nitride which functions as an antireflection layer over a photoelectric conversion portion in order to efficiently use light entering the photoelectric conversion portion is known. Japanese Patent Laid-Open No. 2013-84693 describes a method of forming silicon nitride over a photoelectric conversion portion by low-pressure CVD (LP-CVD) by using hexachlorodisilane (HCD) as a source gas.

SUMMARY OF THE INVENTION

The present inventors have found that the change amount of dark output of a pixel when intense light such as the sunlight irradiates a photoelectric conversion portion differs in accordance with the composition of a silicon nitride layer formed on the photoelectric conversion portion. An aspect of the present invention provides a technique advantageous in improving the characteristics of an imaging apparatus.

According to some embodiments, an imaging apparatus comprising: a substrate including a photoelectric conversion portion; and a silicon nitride layer arranged to cover at least a portion of the photoelectric conversion portion, wherein the silicon nitride layer contains chlorine, and an N/Si composition ratio in the silicon nitride layer is not less than 1.00 and is less than 1.33, is provided.

Further features of the present invention will become apparent from the following description of exemplary embodiments (with reference to the attached drawings).

BRIEF DESCRIPTION OF THE DRAWINGS

FIGS. 1A and 1B are views for explaining a configuration example of an imaging apparatus according to an embodiment, and a circuit configuration example of a pixel formed in the imaging apparatus;

FIGS. 6A to 6C are sectional views showing the example of the method of manufacturing the imaging apparatus of the first embodiment;

DESCRIPTION OF THE EMBODIMENTS

Figure 2A:
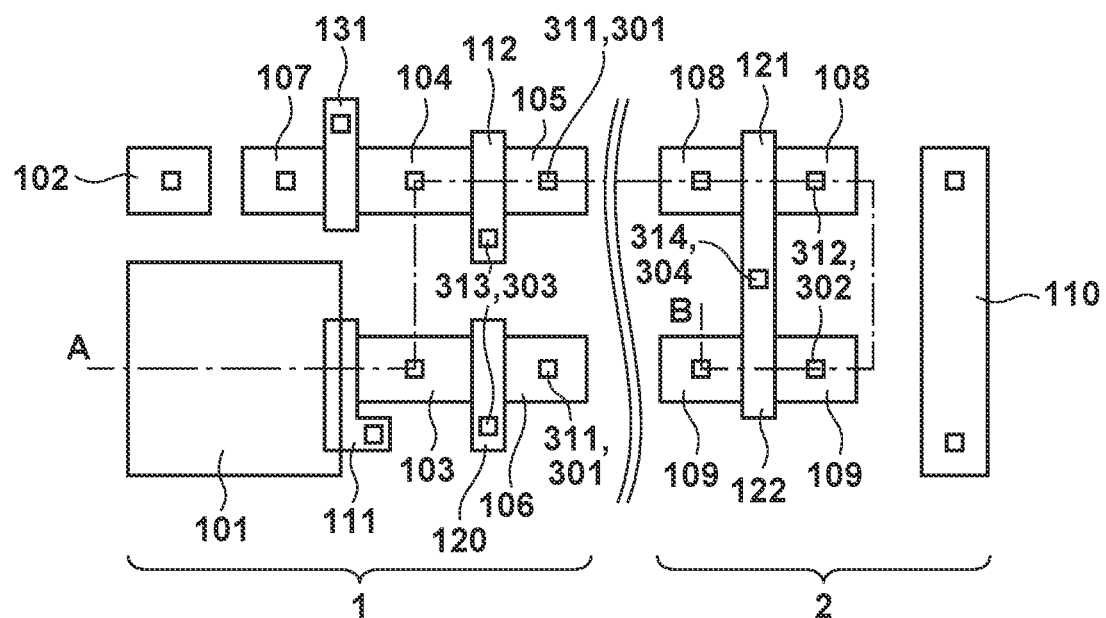
FIGS. 2A and 2B are a plan view and a sectional view showing a configuration example of an imaging apparatus of the first embodiment.

The first embodiment and examples of an imaging apparatus according to the present invention will be explained below with reference to the accompanying drawings. In the following explanation and drawings, the same reference numerals denote the same components throughout a plurality of drawings. Therefore, the same components will be explained by referring to the plurality of drawings, and an explanation of components denoted by the same reference numerals will be omitted.

The arrangement of the imaging apparatus according to the first embodiment of the present invention and a method of manufacturing the same will be explained with reference to FIGS. 1A to 6C. FIG. 1A is a view showing a configuration example of an imaging apparatus 1000 according to the first embodiment of the present invention. The imaging apparatus 1000 includes a pixel region 1 in which a plurality of pixels 10 are arranged, and a peripheral circuit region 2 in which peripheral circuits for, for example, processing signals output from the pixels 10 are arranged. The pixel region 1 and peripheral circuit region 2 are formed on a single substrate 100. The substrate 100 is a semiconductor substrate made of, for example, silicon. Referring to FIG. 1A, a region surrounded by the one-dot dashed line is the pixel region 1, and a region between the one-dot dashed line and a two-dot dashed line is the peripheral circuit region 2. The peripheral circuit region 2 can be said to be positioned around the pixel region 1, and can also be said to be positioned between the pixel region 1 and the edges of the substrate 100. The pixel region 1 shown in FIG. 1A is an example of an area sensor in which the plurality of pixels 10 are arranged in the form of a two-dimensional array. The pixel region 1 may also be a linear sensor in which the plurality of pixels 10 are arranged in a one-dimensional direction.

FIG. 1B is a view showing a circuit configuration example of the individual pixels 10 arranged in the pixel region 1. The pixel 10 includes a photoelectric conversion portion 11, a transfer element 12, a capacitance element 13, an amplification element 15, a reset element 16, and a selection element 17. The photoelectric conversion portion 11 converts incident light into an electric signal. In this embodiment, a photodiode formed in the substrate 100 is used as the photoelectric conversion portion 11.

Transistors formed on the substrate 100 are used as the amplification element 15, reset element 16, and selection element 17. In this specification, each transistor arranged in the pixel 10 will be called a pixel transistor. A MISFET (Metal-Insulator-Semiconductor Field-Effect Transistor) is used as this pixel transistor. It is also possible to use, for example, a MOSFET (Metal-Oxide-Semiconductor Field-Effect Transistor) using silicon oxide as a gate insulating film of the MISFET. However, the gate insulating film is not limited to this, and may also be silicon nitride or the like. The gate insulating film may also be a so-called high-permittivity gate insulating film such as hafnium oxide. Furthermore, the gate insulating film can be formed by stacking these materials, and can also be a compound such as silicon oxynitride.

The transfer element 12 has a MOS-type gate structure. Therefore, when using the transfer element 12 as a gate, the photoelectric conversion portion 11 as a source, and the capacitance element 13 as a drain, this structure can be regarded as a transistor. Accordingly, the photoelectric conversion portion 11, transfer element 12, and capacitance element 13 can be called a pixel transistor.

The transfer element 12 transfers a signal charge generated in the photoelectric conversion portion 11 to the capacitance element 13. The capacitance element 13 functions as a charge-voltage converting element which generates a voltage corresponding to the capacitance and the amount of signal charge in a node 14. The gate of the amplification element 15 is connected to the capacitance element 13 via the node 14. The drain of the amplification element 15 is connected to a power line 21, and the source of the amplification element 15 is connected to an output line 22 via the selection element 17. The gates of the capacitance element 13 and amplification element 15 are connected to the power line 21 via the reset element 16. The potential of the node 14 is reset to a potential corresponding to the potential of the power line 21 by turning on the reset element 16. Also, a signal corresponding to the potential of the node 14 is output from the amplification element 15 to the output line 22 by turning on the selection element 17. The arrangement of the pixel 10 is not limited to the arrangement shown in FIG. 1B, and the electric signal generated by the photoelectric conversion portion 11 in accordance with the incident light need only be output to the peripheral circuit region 2.

In this embodiment, a MOSFET (nMOSFET) having an n-channel is used as each pixel transistor, but a pMOSFET having a p-channel may also be included. The pixel transistors can also include a transistor other than the MISFET. For example, the amplification element 15 can also be a JFET (Junction FET) or bipolar transistor.

In the following explanation of this specification, a conductivity type matching a conductivity type by which a charge to be handled as a signal charge in the pixel region 1 is used as a majority carrier will be called a first conductivity type, and a conductivity type matching a conductivity type by which the charge to be handled as the signal charge is used as a minority carrier will be called a second conductivity type. For example, when using electrons as the signal charge, an n-type is the first conductivity type, and a p-type is the second conductivity type.

The peripheral circuit region 2 will be explained below by referring to FIG. 1A again. The peripheral circuit region 2 includes a signal processing unit 40 for processing the electric signal generated by the pixel 10. The peripheral circuit region 2 also includes an output unit 50 for outputting the signal processed by the signal processing unit 40 to the outside of the imaging apparatus 1000, and a control unit 60 for controlling the pixel region 1 in which the plurality of pixels 10 are arranged, and the signal processing unit 40. The signal processing unit 40, output unit 50, and control unit 60 can be called peripheral circuits.

In this embodiment, the signal processing unit 40 includes an amplification circuit 41 having a plurality of column amplifiers, a conversion circuit 42 having a plurality of A/D converters, and a horizontal scanning circuit 43 for selectively outputting signals from the conversion circuit 42 to the output unit 50. The signal processing unit 40 can perform a correlated double sampling (CDS) process, parallel-serial conversion process, analog-digital conversion process, and the like. The output unit 50 includes an electrode pad and protection circuit. The control unit 60 includes a vertical scanning circuit 61 and a timing generating circuit 62. The arrangement of the peripheral circuit region 2 is not limited to this, and it is only necessary to appropriately process the electric signal generated by each pixel 10 of the pixel region 1, and output the processed signal outside the imaging apparatus 1000.

The peripheral circuits can be formed by using a plurality of transistors, for example, MISFETs like the pixel transistors, and can be configured by CMOS (Complementary MOS) circuits including nMOSFETs and pMOSFETs. In this specification, transistors forming the peripheral circuits will be called peripheral transistors, and will be called peripheral nMOSFETs and peripheral pMOSFETs when specifying the conductivity types. The peripheral circuits may also include passive elements such as a resistance element and capacitance element, in addition to active elements such as a transistor and diode.

Figure 2B:
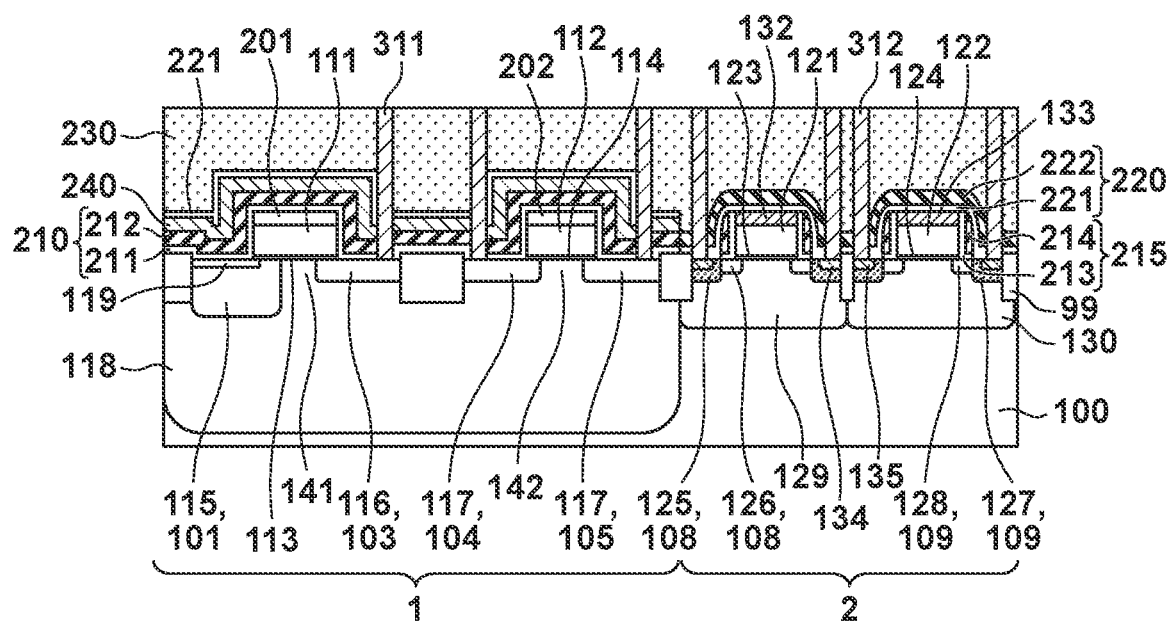

The structure of the imaging apparatus 1000 of this embodiment will be explained below with reference to FIGS. 2A and 2B. FIGS. 2A and 2B are respectively a plan view and sectional view showing portions of the pixel region 1 and peripheral circuit region 2.

Referring to FIG. 2A, a region 101 is equivalent to the photoelectric conversion portion 11, a region 103 is equivalent to the capacitance element 13 and the node 14 for detecting a charge, and a region 106 is equivalent to the drain region of the reset element 16. A region 104 is equivalent to the source region of the amplification element 15, a region 105 is equivalent to the drain region of the amplification element 15, and a region 107 is equivalent to the source of the selection element 17. The region 103 also functions as the source of the reset element 16, and the region 104 also functions as the drain region of the selection element 17. A gate electrode 111 is equivalent to the gate of the transfer element 12, a gate electrode 120 is equivalent to the gate of the reset element 16, a gate electrode 112 is equivalent to the gate of the amplification element 15, and a gate electrode 131 is equivalent to the gate of the selection element 17. Regions 108 and 109 are respectively equivalent to the source/drain regions of the peripheral nMOSFET or peripheral pMOSFET. Gate electrodes 121 and 122 are respectively equivalent to the gates of the peripheral nMOSFET or peripheral pMOSFET. In this embodiment, each gate electrode is formed by polysilicon (polycrystalline silicon). Also, the gate electrodes 121 and 122 are integrated in this embodiment, but they may also be formed independently of each other. The gate electrodes and the regions 103 to 109 equivalent to the source/drain regions are connected to interconnections (not shown) via conductive members 311, 312, 313, and 314 buried in contact holes 301, 302, 303, and 304.

Referring to FIG. 2A, a reference contact region 102 of the pixel 10 can be formed in the pixel region 1. The reference contact region 102 supplies a reference potential such as a ground potential to the pixel 10 via an interconnection (not shown). By arranging a plurality of reference contact regions 102 in the pixel region 1, it is possible to suppress variations in reference potential in the pixel region 1, and suppress the occurrence of shading in a captured image.

In addition, a resistance element 110 can be formed in the peripheral circuit region 2 shown in FIG. 2A. The resistance element 110 is an impurity region formed in the substrate 100. By forming contacts in the two ends of this impurity region, it is possible to obtain a resistance corresponding to the impurity concentration, the distance between the contacts, and the width of the impurity region. In this embodiment, the impurity region of the resistance element 110 is an impurity region having n-type as the first conductivity type formed in a well having p-type as the second conductivity type. Instead, the impurity region of the resistance element 110 can also be a p-type impurity region formed in an n-type well. Furthermore, a resistance element formed by an n-type impurity region and a resistance element formed by a p-type impurity region can also coexist. The peripheral circuit region 2 can also include a passive element other than the resistance element 110, for example, a capacitance element or resistance element having a MOS structure formed by polysilicon.

In this embodiment, the regions 101 and 103, the regions 104, 105, 106, and 107 equivalent to the source/drain regions of the pixel transistors, the reference contact region 102, and the regions 108 equivalent to the source/drain regions of the peripheral nMOSFET are n-type impurity regions. The regions 109 equivalent to the source/drain regions of the peripheral pMOSFET are p-type impurity regions.

FIG. 2B is a sectional view taken along a line A-B shown in FIG. 2A. The substrate 100 is a semiconductor substrate such as silicon as described above. The substrate 100 is divided into a plurality of active regions by element isolation regions 99. The element isolation regions 99 can be made of an insulator for element isolation formed by shallow trench isolation (STI), selective oxidation (LOCOS), or the like. An impurity region is formed in each active region, and each impurity region forms a semiconductor element. Therefore, an impurity region (for example, a p-type impurity region) for p-n junction isolation can be formed as the element isolation region.

A well having a conductivity type corresponding to the conductivity type of an element is formed in the active region of the substrate 100. A p-type well 118 is formed in the pixel region 1, and a p-type well 129 and an n-type well 130 are formed in the peripheral circuit region 2. In addition, a p-type impurity region having an impurity concentration higher than that of the p-type well 118 is formed in the reference contact region 102 shown in FIG. 2A. An interconnection connected to the reference contact region 102 supplies a reference potential to the well 118 via the reference contact region 102.

The sectional structures of the pixel region 1 and peripheral circuit region 2 will now be explained with reference to FIG. 2B. FIG. 2B and FIGS. 4A to 6 (to be described later) depict the pixel region 1 and peripheral circuit region 2 as adjacent to each other for the convenience of explanation. First, the sectional structure of the pixel region 1 will be explained. In the region 101, an n-type storage region 115 forming the photoelectric conversion portion 11 is formed. The storage region 115 forms a p-n junction together with the p-type well 118, and functions as a photodiode of the photoelectric conversion portion 11. A p-type surface region 119 for obtaining the photoelectric conversion portion 11 as a pinned photodiode is formed between the storage region 115 and the surface of the substrate 100. In the region 103, an impurity region 116 forming the capacitance element 13 is formed. The impurity region 116 is a floating diffusion region. N-type impurity regions 117 are formed as the source/drain regions of the amplification element 15, reset element 16, and selection element 17. FIG. 2B shows the section of the amplification element 15, but the reset element 16 and selection element 17 can have the same structure.

Gate insulating films 113 and 114 and gate insulating films of elements such as other pixel transistors of the pixel 10 are mainly made of silicon oxide, and this silicon oxide can contain a slight amount (for example, less than 10%) of nitrogen formed by plasma nitriding or thermal oxynitriding. Silicon oxide containing nitrogen has permittivity higher than that of pure silicon oxide, and hence can improve the drivability of a transistor. However, the arrangement of the gate insulating film is not limited to this, and the gate insulating film can also be either pure silicon oxide or silicon nitride. It is also possible to use a high-permittivity material such as hafnium oxide as described above, or a compound or multilayered film of these materials. The upper surfaces of the gate electrodes 111 and 112 formed on the gate insulating films 113 and 114 on the substrate 100 are covered with insulating layers 201 and 202 containing silicon oxide or silicon nitride.

An insulating film 210 including a silicon oxide layer 211 and a silicon nitride layer 212 (a first silicon nitride layer) is formed on the pixel region 1. The insulating film 210 covers the upper surfaces of the gate electrodes 111 and 112 with the insulating layers 201 and 202 being interposed between them, and also covers the side surfaces of the gate electrodes 111 and 112 without the insulating layers 201 and 202. That is, the silicon nitride layer 212 extends from a portion above the photoelectric conversion portion 11 to a portion above the amplification element 15. The silicon nitride layer 212 (to be described later) is advantageous in not only improving the characteristics of the photoelectric conversion portion 11 but also improving the characteristics of the amplification element 15. Although not shown in FIG. 2B, the insulating film 210 similarly covers the upper surfaces and side surfaces of the gate electrodes 120 and 131. The insulating film 210 also covers the region 101 forming the photoelectric conversion portion 11, and the regions 103 to 107 equivalent to the source/drain regions of the pixel transistors. In this case, the distance between the surface of the substrate 100 and the lower surface of that portion of the silicon nitride layer 212, which covers the region 101 forming the photoelectric conversion portion 11, is shorter than the distance between the surface of the substrate 100 and the upper surface of the gate electrode of the pixel transistor. The shorter the distance between the silicon nitride layer 212 and substrate 100, the larger the influence of the composition of the silicon nitride layer 212. The distance between the silicon nitride layer 212 and substrate 100 can relatively be defined by comparison with the upper surface of the gate electrode as described above. The distance between the silicon nitride layer 212 and substrate 100 is typically less than 100 nm, and may also be less than 50 nm or less than 25 nm.

The insulating film 210 is a multilayered film of the silicon oxide layer 211 and silicon nitride layer 212. The silicon oxide layer 211 and silicon nitride layer 212 have interfaces in contact with each other. In this embodiment, the silicon oxide layer 211 is in contact with the side surfaces of the gate electrodes 111, 112, 120, and 131, but other layers may also be interposed between the silicon oxide layer 211 and the side surfaces of the gate electrodes 111, 112, 120, and 131. Also, the silicon oxide layer 211 is in contact with the region 101 forming the photoelectric conversion portion 11, and with the regions 103 to 107 equivalent to the source/drain regions of the pixel transistors, thereby forming the interface with respect to the substrate 100. However, other layers may also be interposed between them.

The insulating film 210, as a multilayered film of the silicon oxide layer 211 having a refractive index of 1.4 to 1.5 with respect to light having a wavelength of 633 nm and the silicon nitride layer 212 having a refractive index of 1.9 to 2.1 with respect to the same light, covers the region 101 forming the photoelectric conversion portion 11. Consequently, the insulating film 210 can be used as an antireflection layer against light entering the photoelectric conversion portion 11. To obtain good antireflection characteristics, the thickness of the silicon nitride layer 212 can be equal to or larger than that of the silicon oxide layer 211. Furthermore, the thickness of the silicon nitride layer 212 can be larger than that of the silicon oxide layer 211.

A protective film 240 is formed on the insulating film 210 so as to cover it. The protective film 240 can be a monolayered film or multilayered film of an insulator such as silicon oxide or silicon nitride. A silicon oxide layer 221 is formed on the protective film 240 so as to cover it. An insulating film 230 is formed on the silicon oxide layer 221 so as to cover it. The insulating film 230 can be silicate glass such as BPSG, BSG, or PSG, or silicon oxide. The upper surface of the insulating film 230 is a flat surface which substantially does not reflect the unevenness of the surface of the underlayer.

The contact holes 301 and 303 are formed to extend through the insulating film 230, silicon oxide layer 221, protective film 240, and insulating film 210. The conductive members 311 and 313 for electrically connecting interconnections (not shown) and the pixel transistors are formed in the contact holes 301 and 303. In this arrangement shown in FIG. 2A, the conductive members 311 are connected to the regions 103 to 107 equivalent to the source/drain regions of the pixel transistors and the reference contact region 102, and the conductive members 313 are connected to the gate electrodes 111, 112, 120, and 131. The conductive members 311 and 313 are contact plugs mainly made of a metal such as tungsten.

The concentration of chlorine contained in the silicon nitride layer 212 of the insulating film 210 will be explained below. The present inventors have found by experiments that the characteristics of the imaging apparatus change in accordance with the concentration of chlorine contained in the silicon nitride layer 212. More specifically, since the silicon nitride layer 212 containing chlorine covers the region 101, chlorine contained in the silicon nitride layer 212 terminates the dangling bond of the photoelectric conversion portion 11, so the dark current of the imaging apparatus 1000 can be reduced. Since the silicon nitride layer 212 reduces the interface state of the channel of the transistor in the amplification element 15 covered with the silicon nitride layer 212, the noise characteristic of the amplification element 15 can be improved.

Figure 3A:
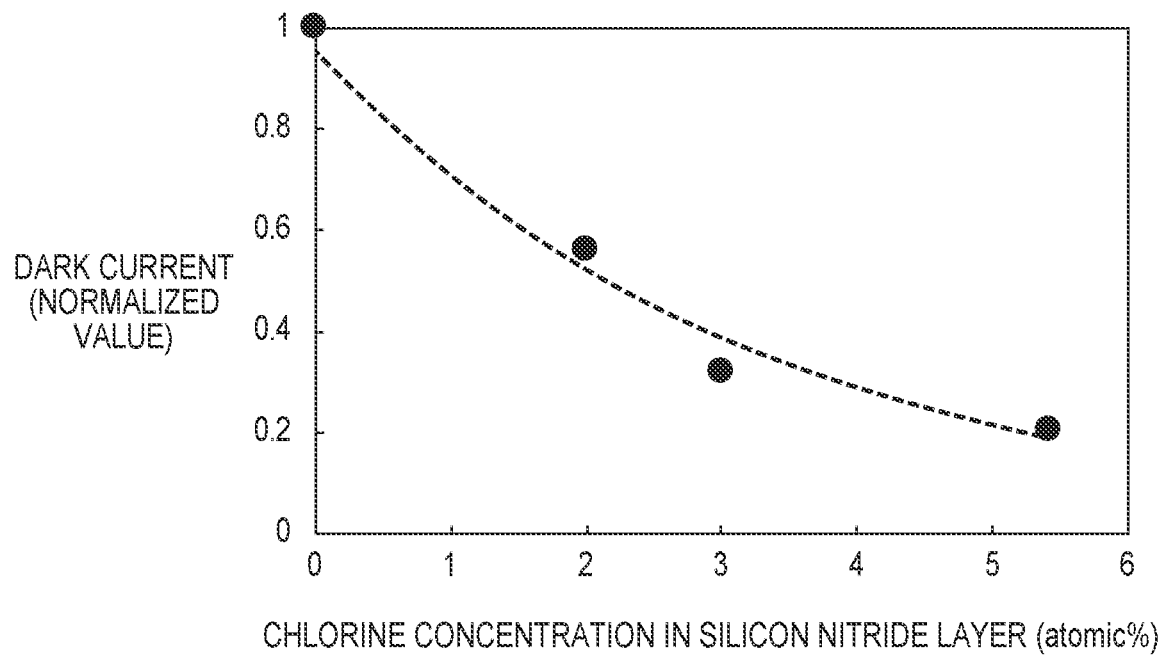
FIGS. 3A and 3B are views for explaining the relationship between a chlorine concentration in a silicon nitride layer and a dark current, and the relationship between an N/Si composition ratio in the silicon nitride layer and the change amount of dark output.

The relationship between the chlorine concentration in the silicon nitride layer 212 and the dark current will be explained below with reference to FIG. 3A. In FIG. 3A, the abscissa indicates the chlorine concentration in the silicon nitride layer 212, and the ordinate indicates the value of the dark current. The value of the ordinate is normalized such that the value of the dark current is 1 when the chlorine concentration is 0 atomic %. FIG. 3A shows that the dark current of the photoelectric conversion portion 11 reduces as the chlorine concentration in the silicon nitride layer 212 increases. Accordingly, the level of the dark current can be decreased by making the silicon nitride layer 212 contain chlorine, compared to a case in which no chlorine is contained in the silicon nitride layer 212. In this embodiment, therefore, the silicon nitride layer 212 contains chlorine. When the silicon nitride layer 212 significantly contains chlorine, the chlorine concentration is typically 0.1 atomic % or more, and more typically 0.3 atomic % or more. The chlorine concentration in the silicon nitride layer 212 can also be less than 1 atomic %. To reduce the dark current, the chlorine concentration in the silicon nitride layer 212 can be any of 1 atomic % or more, 2 atomic % or more, and 3 atomic % or more. If the chlorine concentration in the silicon nitride layer 212 extremely increases, the stability and transmittance decrease. Therefore, the chlorine concentration in the silicon nitride layer 212 can be either 10 atomic % or less or 6 atomic % or less. Especially when the chlorine concentration is higher than 3 atomic %, the optical absorption coefficient (k value) of incident light at a wavelength of 450 nm increases, so the chlorine concentration can be 3 atomic % or less.

The composition ratio of nitrogen and silicon (that is, the N/Si composition ratio) in the silicon nitride layer 212 of the insulating film 210 will be explained below. The present inventors have found by experiments that the characteristics of the imaging apparatus change in accordance with the N/Si composition ratio in the silicon nitride layer 212 of the insulating film 210. More specifically, when the N/Si composition ratio in the silicon nitride layer 212 is less than 1.00, the optical absorption coefficient (k value) on the short-wavelength side of light increases. Accordingly, when the N/Si composition ratio in the silicon nitride layer 212 covering the region 101 is less than 1.00, the silicon nitride layer 212 absorbs incident light, so the characteristics of the region which receives light having entered the photoelectric conversion portion 11 deteriorate. As a consequence, the dark output of the imaging apparatus 1000 in later imaging changes before and after light irradiation. The stoichiometric composition ratio of silicon nitride ($Si_3N_4$) is N/Si=1.33, so silicon nitride having an N/Si composition ratio of less than 1.00 has a silicon-rich composition ratio.

Figure 3B:
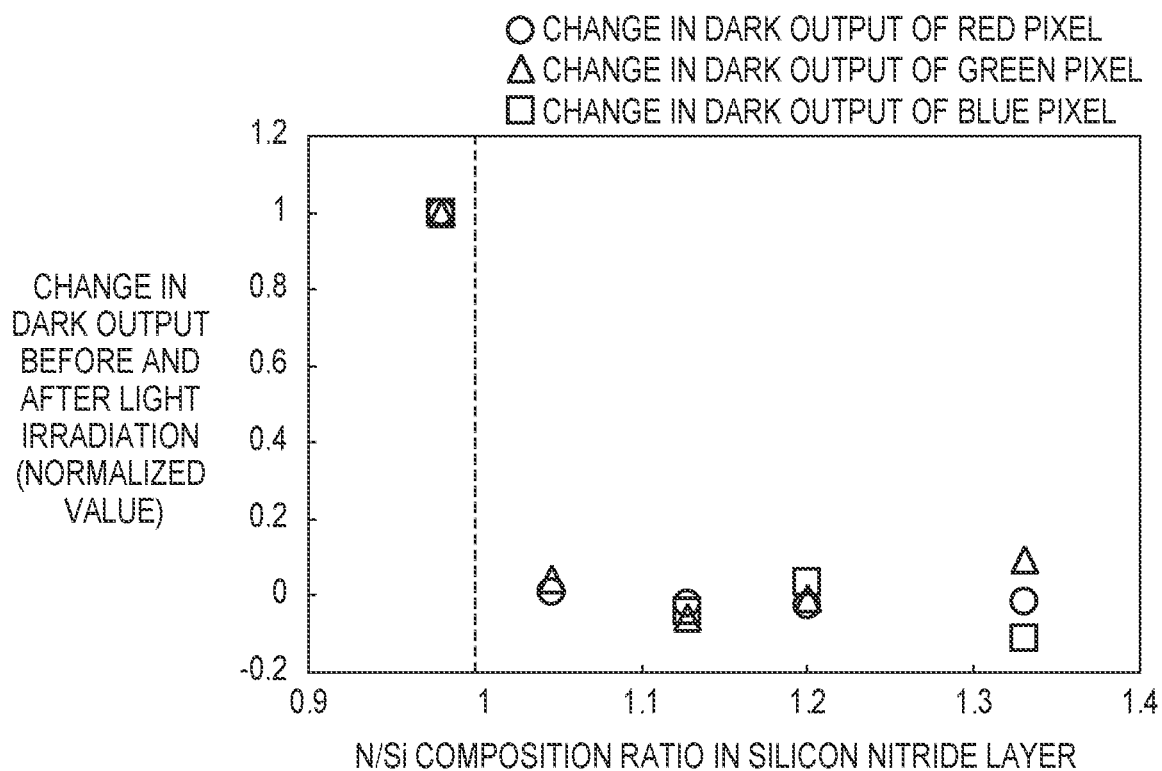

FIG. 3B is a graph for explaining the relationship between the N/Si composition ratio in the silicon nitride layer 212 and the change amount of the dark current before and after light irradiation. In FIG. 3B, the abscissa indicates the N/Si composition ratio, and the ordinate indicates a value obtained by subtracting the dark output (current value) before light irradiation from the dark output (current value) after light irradiation. The value of the ordinate is normalized such that the change amount is 1 when the N/Si composition ratio is 0.98. A circular plot indicates the change amount of the dark output of a red pixel (that is, a pixel for detecting red light; this similarly applies to other colors), a triangular plot indicates the change amount of the dark output of a green pixel, and a square plot indicates the change amount of the dark output of a blue pixel. FIG. 3B reveals that when the N/Si composition ratio in the silicon nitride layer 212 is 1.00 or more, the change amount of the dark output largely reduces compared to a case using a silicon nitride layer having an N/Si composition ratio of less than 1.00. More specifically, assuming that the change amount of the dark current is 1 when the N/Si composition ratio is 0.98, the change amount of the dark current is almost 0 when the N/Si composition ratio is 1 or more and 1.2 or less. In addition, the change amount of the dark current increases when the N/Si composition ratio increases to 1.33. In this embodiment, therefore, the N/Si composition ratio in the silicon nitride layer 212 can be 1.00 or more and less than 1.33. Furthermore, the N/Si composition ratio in the silicon nitride layer 212 can be 1.10 or more and 1.30 or less, and can also be 1.15 or more and 1.25 or less. When the N/Si composition ratio in the silicon nitride layer 212 is 1.15 or more and 1.25 or less, the chlorine concentration in the silicon nitride layer 212 is, for example, 0.5 atomic % or more and 0.7 atomic % or less.

The sectional structure of the peripheral circuit region 2 will be explained below. An n-type impurity region 125, an n-type impurity region 126, and a silicide layer 134 are formed in the regions 108 equivalent to the source/drain regions of the peripheral nMOSFET. The impurity region 125 has an impurity concentration higher than that of the impurity region 126. The silicide layer 134 covers the impurity region 125. A p-type impurity region 127, a p-type impurity region 128, and a silicide layer 135 are formed in the regions 109 equivalent to the source/drain regions of the peripheral pMOSFET. The impurity region 127 has an impurity concentration higher than that of the impurity region 128. The silicide layer 135 covers the impurity region 127. Thus, the peripheral transistors form an LDD (Lightly Doped Drain) structure by the heavily doped impurity regions 125 and 127 and the lightly doped impurity regions 126 and 128.

The gate electrodes 121 and 122 are formed on the substrate 100 with gate insulating films 123 and 124 being interposed between them. In this embodiment, as in the pixel transistors of the pixels 10, the gate insulating film is mainly made of silicon oxide, and this silicon oxide contains a slight amount (for example, less than 10%) of nitrogen formed by plasma nitriding or thermal oxynitriding. The thickness of the gate insulating films 123 and 124 of the peripheral transistor can be equal to or smaller than that of the gate insulating films 113 and 114 of the pixel transistor. For example, the thickness of the gate insulating films 113 and 114 can be 5.0 nm or more and 10 nm or less, and the thickness of the gate insulting films 123 and 124 can be 1.0 nm or more and 5.0 nm or less. By making the thicknesses of the gate insulating films of the pixel transistor and peripheral transistor different from each other, it is possible to increase both the breakdown voltage of the pixel transistor and the driving speed of the peripheral transistor. Silicide layers 132 and 133 forming portions of the gate electrodes 121 and 122 are formed on the upper surfaces of the gate electrodes 121 and 122. Thus, the peripheral transistor can have a SALICIDE (Self-ALIgned siliCIDE) structure in which the silicide layers 132, 133, 134, and 135 are formed. As the metal component forming the silicide layer, it is possible to use titanium, nickel, cobalt, tungsten, molybdenum, tantalum, chromium, palladium, platinum, or the like.

The side surfaces of the gate electrodes 121 and 122 of the peripheral transistors are covered with sidewalls 215. The sidewalls 215 also cover the lightly doped impurity regions 126 and 128 of the regions 108 and 109. In this embodiment, the sidewalls 215 have a multilayered structure including a silicon oxide layer 213 and a silicon nitride layer 214. The silicon oxide layer 213 is positioned between the silicon nitride layer 214 and the gate electrodes 121 and 122, and between the silicon nitride layer 214 and the regions 108 and 109. The silicon oxide layer 213 and silicon nitride layer 214 have interfaces in contact with each other.

An insulating film 220 including a silicon oxide layer 221 and a silicon nitride layer 222 (a second silicon nitride layer) is formed on the peripheral circuit region 2. In this embodiment, the insulating film 220 is a multilayered film of the silicon oxide layer 221 and silicon nitride layer 222. The silicon oxide layer 211 and silicon nitride layer 212 have interfaces in contact with each other. However, the insulating film 220 may also be a monolayered film of the silicon nitride layer 222. The silicon oxide layer 221 is positioned between the silicon nitride layers 214 and 222. The silicon nitride layer 214 and silicon oxide layer 221 have interfaces in contact with each other. That is, the sidewall 215 and insulating film 220 have interfaces in contact with each other. Furthermore, the insulating film 220 covers the silicide layers 134 and 135 in the regions 108 and 109. The insulating film 220 and the silicide layers 134 and 135 in the regions 108 and 109 have interfaces in contact with each other. Although the silicide layers 134 and 135 are formed in this embodiment, the silicide layers 134 and 135 need not always be formed. In this case, the insulating film 220 covers the heavily doped impurity regions 125 and 127. The insulating film 220 and the heavily doped impurity regions 125 and 127 have interfaces in contact with each other. As in the pixel region 1, the insulating film 230 is formed on the insulating film 220. The contact holes 302 and 304 are formed to extend through the insulating film 230 and the insulating film 220 including the silicon oxide layer 221 and silicon nitride layer 222. The conductive members 312 and 314 for electrically connecting interconnections (not shown) and the regions 108 as the source/drain regions of the peripheral transistor and the gate electrodes 121 and 122 are formed in the contact holes 302 and 304. Like the conductive members 311 and 313, the conductive members 312 and 314 are contact plugs mainly made of a metal such as tungsten.

A wiring pattern (not shown) including the interconnections to be connected to the conductive members 311, 312, 313, and 314 is formed on the insulating film 230. This wiring pattern can be obtained by stacking a plurality of wiring patterns with interlayer dielectric films being interposed between them. The wiring patterns can be made of a metal such as aluminum or copper. In addition, color filters (not shown) and microlenses (not shown) can be formed on the light-receiving surface of the substrate 100, which receives light. These components can be formed by using the existing techniques, so an explanation thereof will be omitted. The imaging apparatus 1000 is accommodated in a package or the like, and an imaging system such as a device or information terminal incorporating this package can be constructed.

Figure 4A:
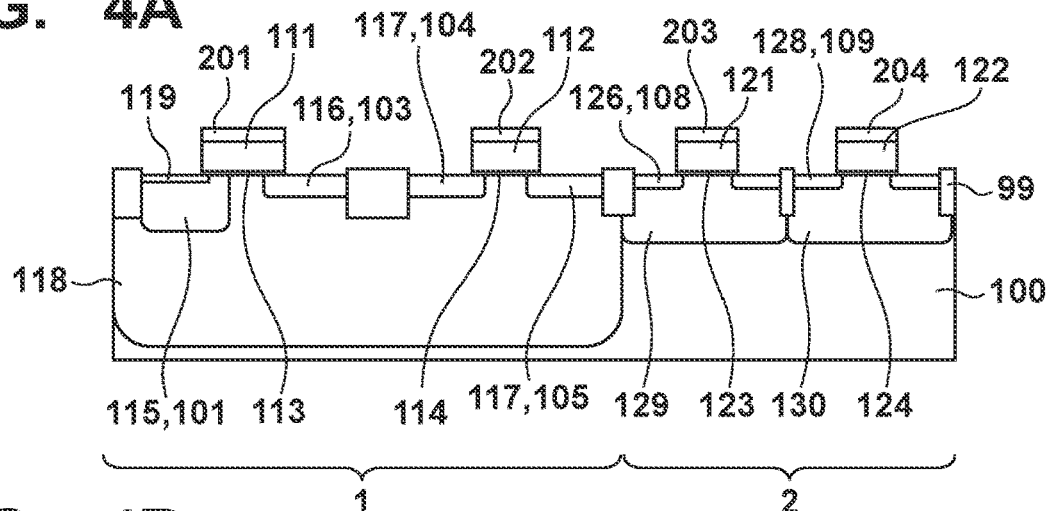
FIGS. 4A to 4C are sectional views showing an example of a method of manufacturing the imaging apparatus of the first embodiment.

Next, a method of manufacturing the imaging apparatus 1000 will be explained with reference to FIGS. 4A to 6C. FIGS. 4A to 6C are sectional views of the manufacturing steps of the imaging apparatus 1000. First, as shown in FIG. 4A, pixel transistors and peripheral transistors are formed. In this step of forming the pixel transistors and peripheral transistors, element isolation regions 99 are formed in a substrate 100 by using STI, LOCOS, or the like. The substrate 100 can be a silicon wafer cut out from a silicon ingot, and can also be a wafer obtained by epitaxially growing a single-crystal silicon layer on a silicon wafer. After the element isolation regions 99 are formed, wells 118 and 129 having the second conductivity type (p-type) and a well 130 having the first conductivity type (n-type) are formed.

After the wells 118, 129, and 130 are formed, gate insulating films 113, 114, 123, and 124 are formed, and polysilicon is deposited on the gate insulating films 113, 114, 123, and 124. The gate insulating films 113, 114, 123, and 124 can be formed in the pixel region 1 and peripheral circuit region 2 at the same time. Alternatively, these gate insulating films can also be formed in the pixel region 1 and peripheral circuit region 2 by using different steps in order to obtain different film thicknesses, as described previously. Then, impurities are implanted by ion implantation or the like in each portion of polysilicon that is to be a gate electrode in accordance with the conductivity types of corresponding transistors. After this impurity implantation, insulating layers 201, 202, 203, and 204 functioning as hard masks are formed on those portions of polysilicon, which will function as gate electrodes 111, 112, 121, and 122. After that, polysilicon in openings is etched by using the insulating layers 201, 202, 203, and 204 as masks. In this step, n-type gate electrodes 111, 112, and 121 and a p-type gate electrode 122 are formed.

Subsequently, an n-type storage region 115 and a p-type surface region 119 are formed. Also, an impurity region 116 in the region 103 and n-type impurity regions 117 having a single drain structure which function as the source/drain regions of the pixel transistors are formed. In addition, a lightly doped n-type impurity region 126 and p-type impurity region 128 having an LDD structure of the peripheral transistors are formed. When forming the impurity regions 116 and 117 of the pixels 10, the dose can be $5 \times 10^{12}$ to $5 \times 10^{14}$ (ions/cm$^2$), and can also be $1 \times 10^{13}$ to $1 \times 10^{14}$ (ions/cm$^2$). When forming the lightly doped impurity regions 126 and 128 having the LDD structure, the dose can be $5 \times 10^{12}$ to $5 \times 10^{14}$ (ions/cm$^2$), and can also be $1 \times 10^{13}$ to $1 \times 10^{14}$ (ions/cm$^2$). Accordingly, impurity implantation of the impurity regions 116 and 117 and the impurity region 126 can also be performed in parallel. Furthermore, the order of impurity implantation of the storage region 115, impurity regions 116, 117, 126, and 128, and surface region 119 can be any order.

Figure 4B:
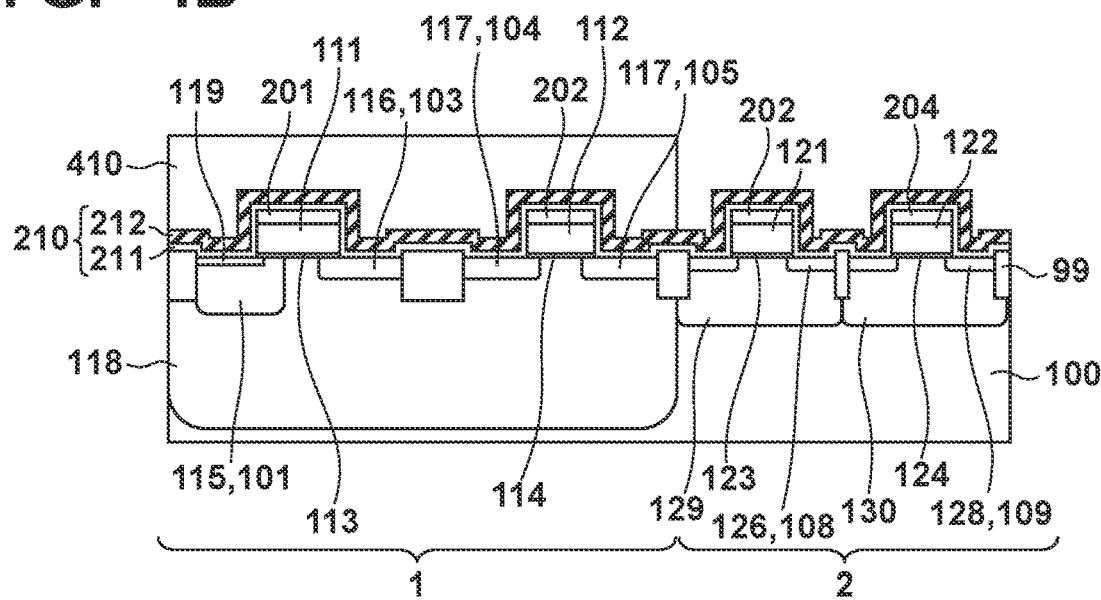

Then, as shown in FIG. 4B, an insulating film 210 including a silicon oxide layer 211 and a silicon nitride layer 212 is formed. The insulating film 210 covers the upper surfaces and side surfaces of the gate electrodes 111, 112, 121, and 122, and the regions 103, 104, 105, 108, and 109 serving as the source/drain regions of the pixel transistors and peripheral transistors, and the region 101. The impurity regions 116, 117, 126, and 128 are formed in the source/drain regions by the step shown in FIG. 4A, so the insulating film 210 covers the impurity regions 116, 117, 126, and 128.

The insulating film 210 is a multilayered film of the silicon oxide layer 211 and silicon nitride layer 212, and the silicon oxide layer 211 and silicon nitride layer 212 are formed in contact with each other. The step of forming the insulating film 210 includes a step of forming the silicon oxide layer 211 and a step of forming the silicon nitride layer 212. As described previously, the insulating film 210 covers at least the region 101 which functions as the photoelectric conversion portion 11 so as to be used as an antireflection layer, and the thickness of the silicon nitride layer 212 can be equal to or larger than that of the silicon oxide layer 211 in order to obtain good antireflection characteristics. For example, the thickness of the silicon oxide layer 211 can be 5 nm or more and 20 nm or less, and the thickness of the silicon nitride layer 212 can be 20 nm or more and 100 nm or less.

In this embodiment, the silicon oxide layer 211 and silicon nitride layer 212 are formed by using CVD (Chemical Vapor Deposition). The silicon oxide layer 211 is formed by using LPCVD (Low-Pressure CVD) as thermal CVD in which the pressure (deposition pressure) of a process gas containing a source gas such as TEOS is 20 Pa or more and 200 Pa or less. In this step, the deposition temperature (substrate temperature) can be 500° C. or more and 800° C. or less. The process gas herein mentioned means the whole gas in a deposition chamber containing at least the source gas and containing a carrier gas added as needed. As this carrier gas, it is possible to use a rare gas such as helium or argon, or nitrogen. Also, the deposition pressure means the pressure (total pressure) of the process gas in the deposition chamber.

The silicon nitride layer 212 is formed by using LPCVD by using a process gas containing, for example, ammonia (NH$_3$) and hexachlorodisilane (HCD) as source gases. In this step, the pressure (deposition pressure) of the process gas can be 20 Pa or more and 200 Pa or less, and the deposition temperature (substrate temperature) can be 500° C. or more and 800° C. or less.

Figure 7:
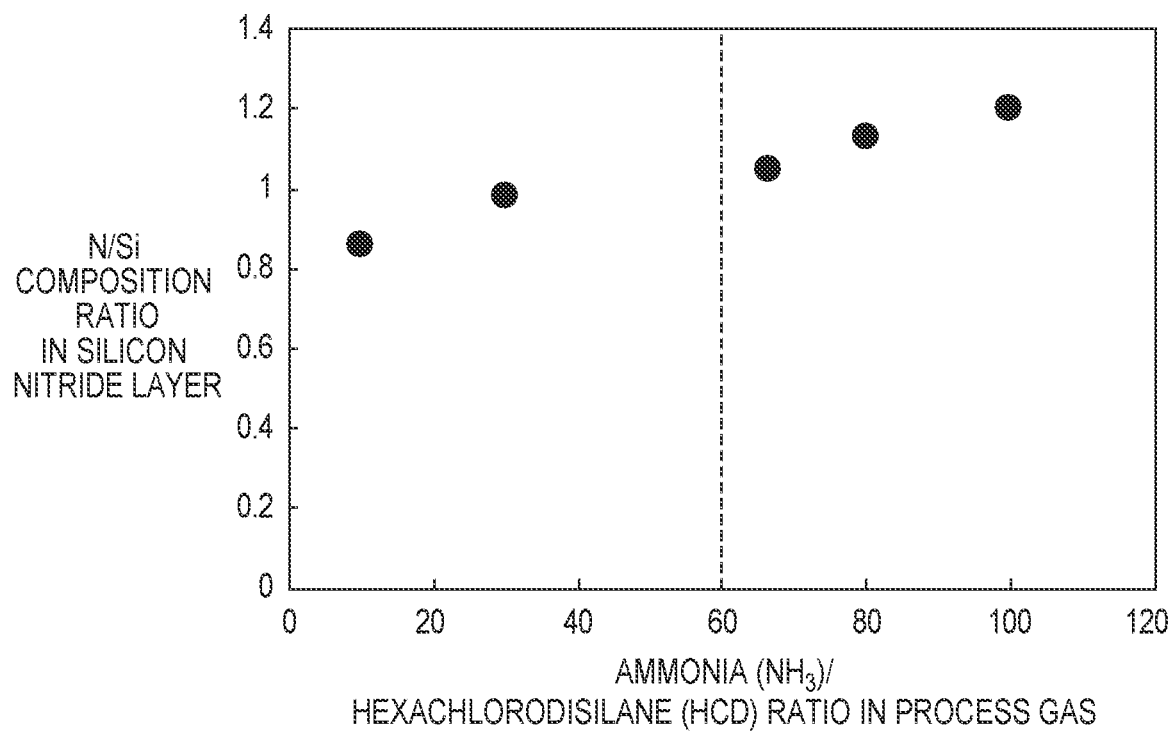
FIG. 7 is a view for explaining the relationship between an ammonia/hexachlorodisilane ratio in a process gas of the deposition conditions of the silicon nitride layer and the N/Si composition ratio in the silicon nitride layer.

In this embodiment as described earlier, to reduce the dark current and the change amount of the dark output, the N/Si composition ratio of the silicon nitride layer 212 to be used as an antireflection layer is 1.00 or more and less than 1.33, and the silicon nitride layer 212 contains chlorine. FIG. 7 is a view for explaining the relationship between an ammonia/hexachlorodisilane ratio (to be referred to as an NH$_3$/HCD ratio hereinafter) in the process gas of the deposition conditions of the silicon nitride layer 212 and the N/Si composition ratio in the silicon nitride layer 212. In FIG. 7, the abscissa indicates the NH$_3$/HCD ratio, and the ordinate indicates the N/Si composition ratio in the silicon nitride layer 212. FIG. 7 shows that the N/Si composition ratio increases as the NH$_3$/HCD ratio increases. In this embodiment, the NH$_3$/HCD ratio is set at 60 or more so that the N/Si composition ratio in the silicon nitride layer 212 becomes 1.00 or more. Also, the NH$_3$/HCD ratio is set at less than 120 so that the N/Si composition ratio in the silicon nitride layer 212 becomes less than 1.33.

As the deposition conditions of the silicon nitride layer 212 by which the N/Si composition ratio in the silicon nitride layer 212 becomes about 1.00, it is possible to adopt, for example, the following conditions.
Deposition temperature: 550° C. to 650° C.
HCD: 20 to 40 sccm
NH$_3$: 1,300 to 2,700 sccm
Deposition pressure: 20 to 30 Pa As the deposition conditions of the silicon nitride layer 212 by which the N/Si composition ratio in the silicon nitride layer 212 becomes about 1.10, it is possible to adopt, for example, the following conditions.
Deposition temperature: 550° C. to 650° C.
HCD: 15 to 35 sccm
NH$_3$: 1,200 to 2,800 sccm
Deposition pressure: 20 to 30 Pa As the deposition conditions of the silicon nitride layer 212 by which the N/Si composition ratio in the silicon nitride layer 212 becomes about 1.20, it is possible to adopt, for example, the following conditions.
Deposition temperature: 550° C. to 650° C.
HCD: 10 to 30 sccm
NH$_3$: 1,000 to 3,000 sccm
Deposition pressure: 20 to 30 Pa The N/Si composition ratio in the silicon nitride layer 212 can be changed by increasing/decreasing the flow rates of HCD and NH$_3$ in the process gas.

As disclosed in Japanese Patent Laid-Open No. 2013-84693, the silicon nitride layer 212 formed by using the process gas containing hexachlorodisilane (HCD) and ammonia (NH$_3$) as the source gases contains a large amount of hydrogen in addition to silicon, nitrogen, and chlorine. Therefore, the silicon nitride layer 212 can function as a hydrogen supply source for terminating the dangling bond of the pixel transistor. Also, when at least the silicon oxide layer 212 is formed, the composition ratio of chlorine in the silicon nitride layer 212 can be lower than the composition ratios of nitrogen and hydrogen. In other words, the composition ratio of hydrogen in the silicon nitride layer 212 can be higher than that of chlorine in the silicon nitride layer 212. The composition ratio of hydrogen in the silicon nitride layer 212 can be either higher or lower than the composition ratios of silicon and nitrogen in the silicon nitride layer 212. Since hydrogen is a light element, hydrogen in the silicon nitride layer 212 need not be taken into consideration of the stoichiometric composition of the silicon nitride layer 212.

Figure 4C:
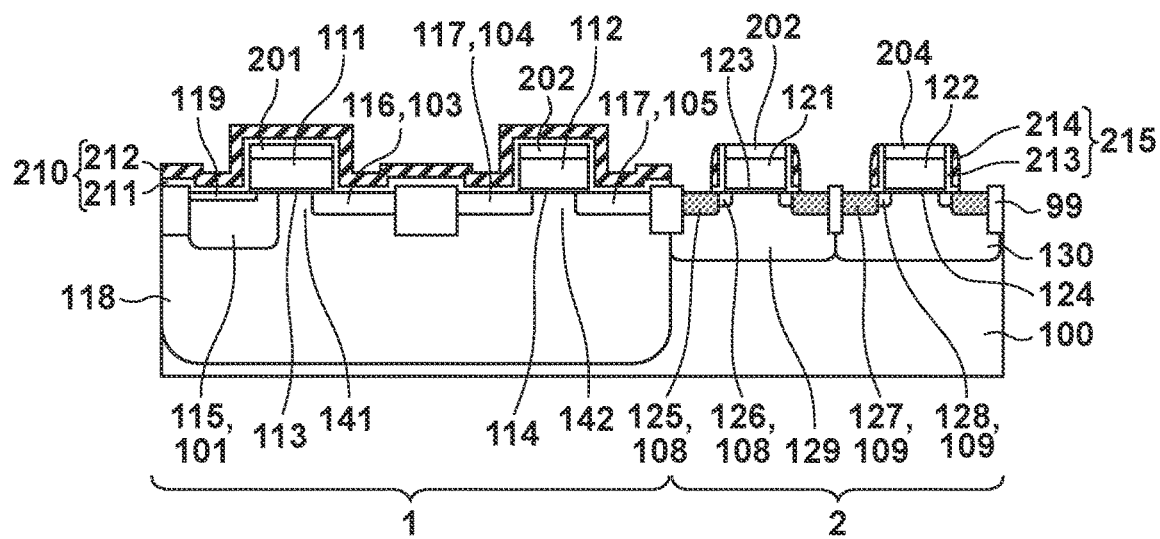

After the insulating film 210 is formed, sidewalls 215 are formed on the side surfaces of the gate electrodes 121 and 122 of the peripheral transistors. First, as shown in FIG. 4B, a mask pattern 410 is formed on the insulating film 210 by using a photoresist or the like. The mask pattern 410 is so formed as to cover at least a portion of the region 101 functioning as the photoelectric conversion portion 11 in the pixel region 1. Since the mask pattern 410 covers at least a portion of the region 101, the silicon nitride layer 212 having an N/Si composition ratio of 1.00 or more and less than 1.33 and containing chlorine remains on at least a portion of the region 101. In this embodiment, the mask pattern 410 covers the pixel region 1 including the regions 101, 103, 104, and 105, and has an opening in the peripheral circuit region 2. Then, the insulating film 210 in the opening of the mask pattern 410 is etched (etched back). By removing the mask pattern 410 after etching, the sidewalls 215 covering the side surfaces of the gate electrodes 121 and 122 of the peripheral transistors are formed as shown in FIG. 4C. The sidewalls 215 can be a stack of a silicon oxide layer 213 and a silicon nitride layer 214 (a third silicon nitride layer). The silicon oxide layer 213 is a part of the silicon oxide layer 211 of the insulating film 210, and the silicon nitride layer 214 is a part of the silicon nitride layer 212 of the insulating film 210. Therefore, the silicon nitride layers 214 and 212 are equal to each other in N/Si composition ratio and chlorine concentration.

The etching forming the sidewalls 215 exposes regions in the region 108 where the impurity regions 125 and 127 are to be formed. Also, in this etching step, a region for forming the resistance element 110 shown in FIG. 2A is exposed.

During the etching forming the sidewalls 215, a portion of the insulating film 210 above the region 101 remains because the mask pattern 410 covers the region 101. This suppresses etching damage to the photoelectric conversion portion 11, and makes it possible to reduce noise produced in the photoelectric conversion portion 11. Also, since the mask pattern 410 covers the gate electrodes 111 and 112 and regions 103 and 104, the insulting film 210 formed above the channel regions 141 and 142 and source/drain regions of the pixel transistors remains. This suppresses etching damage to the pixel transistors, and makes it possible to reduce noise produced in the pixel transistors.

In the etching forming the sidewalls 215, after the regions for forming impurity regions 125 and 127 in the region 108 are exposed, self-aligned heavily doped impurity regions 125 and 127 are formed along the side surfaces of the sidewalls 215. A mask pattern covering the pixel region 1 and peripheral pMOSFET is formed, and an n-type impurity is implanted by ion implantation or the like by using this mask pattern and the gate electrode 121 and sidewalls 215 as masks. Consequently, the impurity region 125 of the peripheral nMOSFET is formed. Also, a mask pattern covering the pixel region 1 and peripheral nMOSFET is formed, and a p-type impurity is implanted by ion implantation or the like by using this mask pattern and the gate electrode 122 and sidewalls 215 as masks. As a consequence, the impurity region 127 of the peripheral pMOSFET is formed. The formation order of the impurity regions 125 and 127 is an arbitrary order. When forming the heavily doped impurity regions 125 and 127 having the LDD structure, the dose can be $5\times10^{14}$ to $5\times10^{16}$ (ions/cm$^2$), and can also be $1\times10^{15}$ to $1\times10^{16}$ (ions/cm$^2$). The dose when forming the impurity regions 125 and 127 is higher than that when forming the above-described impurity regions 126 and 128. Consequently, the impurity concentration in the impurity regions 125 and 127 becomes higher than that in the impurity regions 126 and 128.

When forming at least one of the impurity regions 125 and 127, an impurity can simultaneously be implanted into a region for forming a resistance element 110. As a consequence, the resistance element 110 as a diffusion resistance is formed. The dose when forming the impurity regions 126 and 128 decreases the impurity concentration, so it may be impossible to decrease the resistance value of the resistance element 110 to a practical range. On the other hand, the dose when forming the impurity regions 125 and 127 can form an impurity region of the resistance element 110 having a practical resistance value. Therefore, a region for forming the resistance element 110 is exposed by the etching forming the sidewalls 215, and an impurity region of the resistance element 110 is formed at the same time the impurity is implanted into the impurity region 125 or 127.

Figure 5A:
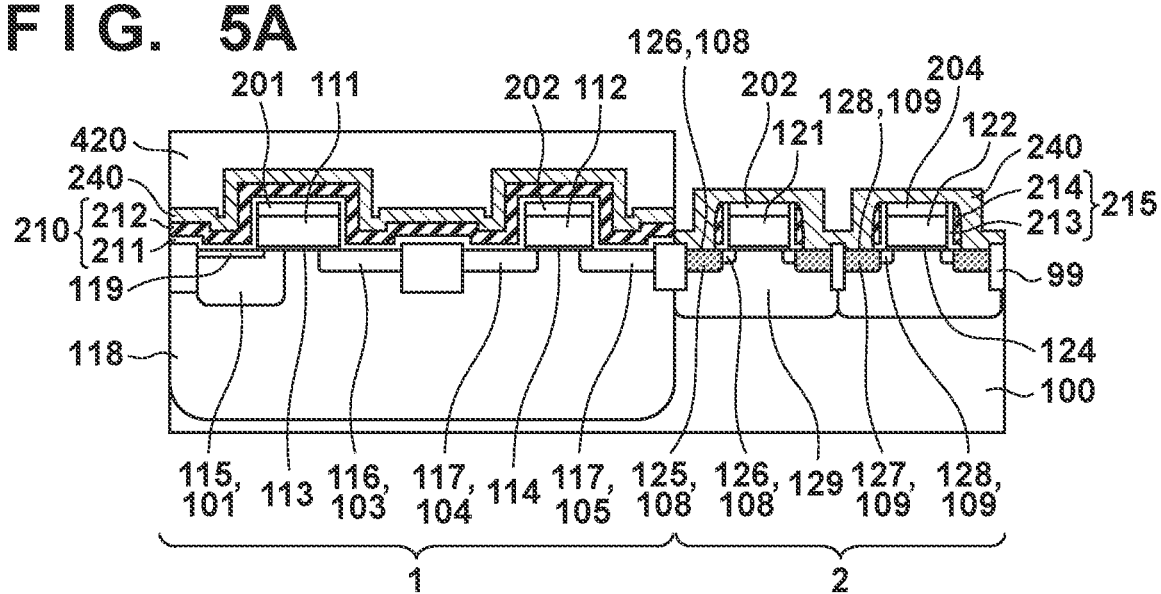
FIGS. 5A to 5C are sectional views showing the example of the method of manufacturing the imaging apparatus of the first embodiment.

After the LDD structure of the peripheral transistors is formed, as shown in FIG. 5A, a protective film 240 is so formed as to cover the pixel region 1 and peripheral circuit region 2. The protective film 240 is made of silicon oxide or the like, and has a thickness of about 30 nm or more and 130 nm or less. After the formation of the protective film 240, a mask pattern 420 covering the pixel region 1 is formed by using a photoresist or the like. After the formation of the mask pattern 420, the protective film 240 in openings of the mask pattern 420 is etched. This etching removes those portions of the protective film 240, which are positioned above the regions 108 and 109, and those portions of the protective film 240, which are positioned above the gate electrodes 121 and 122. In this step, those portions of the protective film 240, which are positioned above the pixel region 1 and resistance element 110, are left behind. Following the etching of the protective film 240, the insulating layers 203 and 204 covering the upper surfaces of the gate electrodes 121 and 122 are removed. This etching of the insulating layers 203 and 204 can be performed simultaneously with or independently of the etching of the protective film 240. The mask pattern 420 is removed after the etching of the protective film 240 and insulating layers 203 and 204.

Figure 5B:
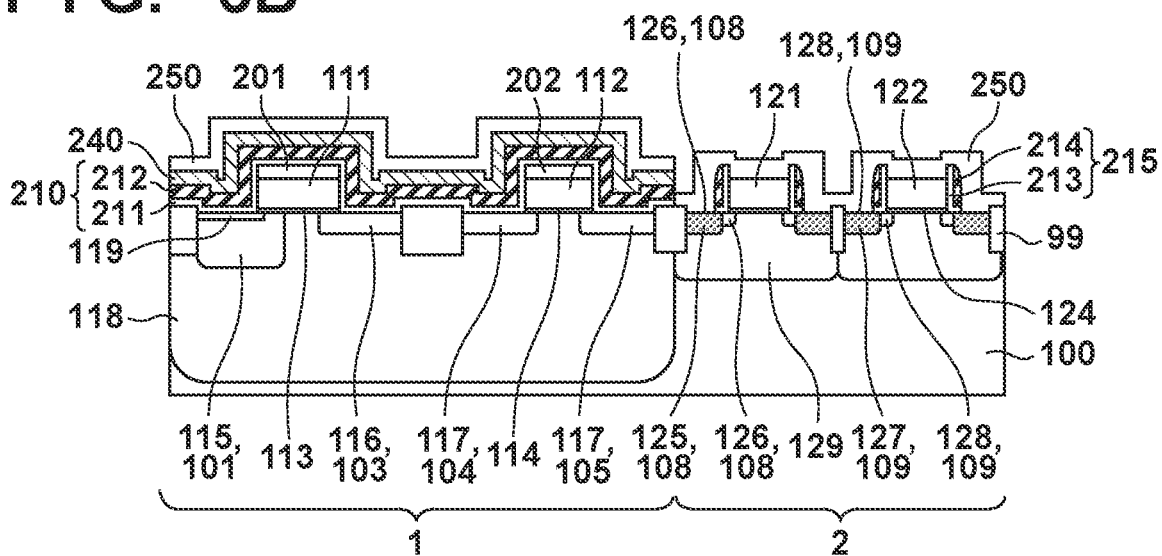

Subsequently, as shown in FIG. 5B, a metal film 250 is formed by sputtering or CVD so as to cover the substrate 100. The metal film 250 is formed in contact with the upper surfaces of the regions 108 and 109 and gate electrodes 121 and 122, and contains a metal which silicifies the upper surfaces of the regions 108 and 109 and gate electrodes 121 and 122. The metal film 250 is in contact with the protective film 240 above the pixel region 1 and resistance element 110 which are not to be silicified. The metal film 250 may have a multilayered structure containing a metal for silicidation and a metal compound which suppresses the oxidation of the metal. For example, the metal film 250 may also be a multilayered film of cobalt and titanium nitride for suppressing the oxidation of cobalt.

After the formation of the metal film 250, the metal film 250 is caused to react with the regions 108 and 109 and gate electrodes 121 and 122 in contact with the metal film 250 by heating the substrate 100 to about 500° C. Consequently, silicide layers 132, 133, 134, and 135 in a monosilicide state are formed. After that, an unreacted metal film 250 positioned on the protective film 240 and sidewalls 215 is removed. Also, if a layer of the metal compound for suppressing the oxidation of the metal is formed in the metal film 250, this metal compound layer is also removed. After the unreacted metal film 250 is removed, the substrate 100 is heated to about 800° C. which is higher than the temperature used in the first silicidation, thereby changing the silicide layers 132, 133, 134, and 135 from the monosilicide state to a disilicide state. In this embodiment, heating is performed twice at different temperatures. However, the silicide layers 132, 133, 134, and 135 may also be formed by performing heating once. Silicidation conditions can appropriately be selected in accordance with, for example, the type of metal for forming silicide.

Figure 5C:
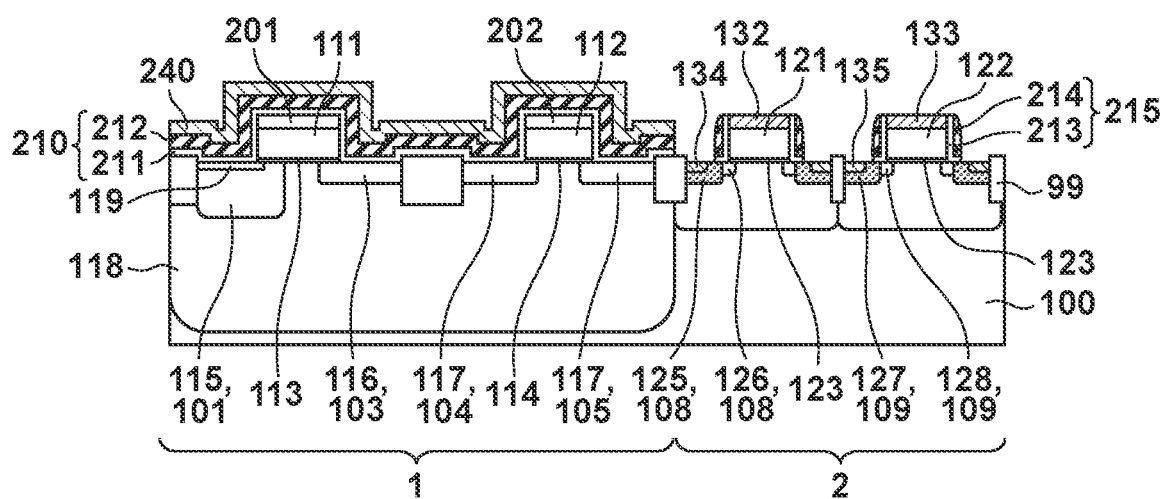

In the silicidation step, no silicide layer is formed in the pixel region 1 and resistance element 110 where the protective film 240 remains, because the metal film 250 is not in contact with the substrate 100 and gate electrodes. The protective film 240 thus functions as a silicide block. Since a silicide layer can cause noise in the pixel region 1, the pixel region 1 is covered with the protective film 240 during silicidation. In particular, silicidation is not performed on the region 101 serving as the photoelectric conversion portion 11, the region 103 serving as the node 14 for detecting a charge, and the regions 104 and 105 serving as the source/drain regions of the amplification element 15. The resistance element 110 is also protected by the protective film 240 because the resistance value may become too small. The protective film 240 can be removed after the silicide layers 132, 133, 134, and 135 are formed. However, the protective film 240 may also remain in order to avoid unnecessary damage to the pixel region 1. In this embodiment, the protective film 240 is left behind as shown in FIG. 5C.

After the formation of the silicide layers 132, 133, 134, and 135, as shown in FIG. 6A, an insulting film 220 including a silicon oxide layer 221 and a silicon nitride layer 222 is formed. The insulating film 220 covers the upper surfaces of the gate electrodes 111, 112, 121, and 122, the sidewalls 215, the regions 103, 104, 105, 108, and 109 serving as the source/drain regions of the pixel transistors and peripheral transistors, and the region 101.

The insulating film 220 is a multilayered film of the silicon oxide layer 221 and silicon nitride layer 222. The silicon oxide layer 221 and silicon nitride layer 222 are formed in contact with each other. The step of forming the insulating film 220 includes a step of forming the silicon oxide layer 221 and a step of forming the silicon nitride layer 222. The thickness of the silicon nitride layer 222 can be equal to or larger than that of the silicon oxide layer 221. The thickness of the silicon nitride layer 222 can be twice or more the thickness of the silicon oxide layer 221. For example, the thickness of the silicon oxide layer 221 can be 10 nm or more and 30 nm or less, and the thickness of the silicon nitride layer 222 can be 20 nm or more and 100 nm or less.

The silicon oxide layer 221 is formed by sub-atmospheric CVD (SA-CVD) as thermal CVD in which the pressure (deposition pressure) of a process gas containing a source gas such as TEOS is 200 Pa or more and 600 Pa or less. In this step, the deposition temperature (substrate temperature) can be 400° C. or more and 500° C. or less. Thus, both the silicon oxide layers 211 and 221 can be formed by thermal CVD.

The silicon nitride layer 222 is formed by LPCVD by using a process gas containing, for example, ammonia ($NH_3$) and hexachlorodisilane (HCD) as source gases. In this step, the pressure (deposition pressure) of the process gas is 20 Pa or more and 200 Pa or less, and the deposition temperature (substrate temperature) can be 500° C. or more and 800° C. or less.

The silicon nitride layer 222 can also function as a chlorine supply source for stably supplying chlorine to the peripheral transistors. The thick silicon nitride layer 222 can contain a large amount of chlorine, and the thin silicon oxide layer 221 can appropriately transmit chlorine. Also, the silicon nitride layer 222 formed by using the process gas containing hexachlorodisilane (HCD) and ammonia ($NH_3$) as the source gases as described above contains a large amount of hydrogen. This makes it possible to form the peripheral transistor having excellent noise characteristics.

After the formation of the insulating film 220, as shown in FIG. 6A, a mask pattern 430 is formed by using a photoresist or the like so as to cover that portion of the insulating film 220, which is positioned in the peripheral circuit region 2. Then, those portions of the silicon nitride layer 212, which are arranged in the pixel region 1, are removed through openings of the mask pattern 430. The portions to be removed of the silicon nitride layer 212 include those portions of the silicon nitride layer 212, which are positioned above the photoelectric conversion portion 11, transfer element 12, capacitance element 13, amplification element 15, reset element 16, and selection element 17. In this step, the silicon oxide layer 221 can function as an etching stopper when etching away the silicon nitride layer 222 covering the pixel region 1. The silicon oxide layer 221 can also function as a protective layer which protects the pixel region 1 from etching damage. The silicon nitride layer 222 arranged above at least the photoelectric conversion portion 11 in the pixel region 1 is removed.

Subsequently, an insulating film 230 is so formed as to cover the pixel region 1 and peripheral circuit region 2. The insulating film 230 is a monolayered silicon oxide film deposited by plasma CVD such as HDP (High Density Plasma) CVD. The insulating film 230 can be formed from an arbitrary material such as a BPSG film, BSG film, or PSG film. In addition, the insulating film 230 is not limited to a monolayered film and may be a multilayered film.

Then, as shown in FIG. 6B, the surface of the insulating film 230 is planarized. As the method of planarization, it is possible to use, for example, CMP (Chemical Mechanical Polishing), reflow, or etch back. It is also possible to use these methods by combining them. The thickness of the insulating film 230 before the planarization can be, for example, 200 nm or more and 1,700 nm or less. In this embodiment, those portions of the silicon nitride layer 222, which are positioned above the pixel region 1, are removed by the above-described step, and this decreases the difference between the heights of the pixel region 1 and peripheral circuit region 2 below the insulating film 230. Accordingly, the thickness of the planarized insulating film 230 can be decreased to 1,000 nm or less. For example, the thickness of the insulating film 230 may also be 450 nm or more and 850 nm or less. It is possible to reduce the resistance and increase the sensitivity of a contact plug by decreasing the thickness of the insulating film 230. The thickness of the planarized insulating film 230 can also be larger than those of the insulating films 210 and 220.

After the planarization of the insulating film 230, conductive members 311, 312, 313, and 314 for electrically connecting the pixel transistors and peripheral transistors to interconnections are formed. First, in the pixel region 1, a hole is formed in the insulating film 230 by anisotropic etching through an opening of a mask pattern such as a photoresist covering the insulating film 230, thereby forming a contact hole 301 for forming a conductive member 311. When forming the contact hole 301, the silicon nitride layer 212 of the insulating film 210 can be used as an etching stopper in the pixel region 1. The contact hole 301 is formed to extend through the insulating film 230, silicon oxide layer 221, protective film 240, silicon nitride layer 212, and silicon oxide layer 211. The contact hole 301 exposes the source/drain regions of the capacitance element 13, amplification element 15, reset element 16, and selection element 17, and the reference contact region 102.

In parallel with the formation of the contact hole 301, a contact hole 303 for exposing the gate electrodes of the capacitance element 13, amplification element 15, reset element 16, and selection element 17 is formed. The contact hole 303 for forming a conductive member 313 extends through the insulating film 230, silicon oxide layer 221, protective film 240, silicon nitride layer 212, and silicon oxide layer 211. This contact hole for forming the conductive member 313 further extends through the insulating layers 201 and 202. To reduce the contact resistance of a contact plug, it is also possible to implant an impurity into the impurity regions and gate electrodes of the substrate 100 through the contact hole.

Before the formation of the contact hole 301, the silicon nitride layer 222 positioned above the pixel region 1 is removed as described above. Therefore, there is no silicon nitride layer above the silicon nitride layer 212 to be used as an etching stopper. When forming the contact hole 301, therefore, it is possible to suppress a silicon nitride layer other than the silicon nitride layer 212 from preventing the formation of the contact hole 301.

Figure 6C:
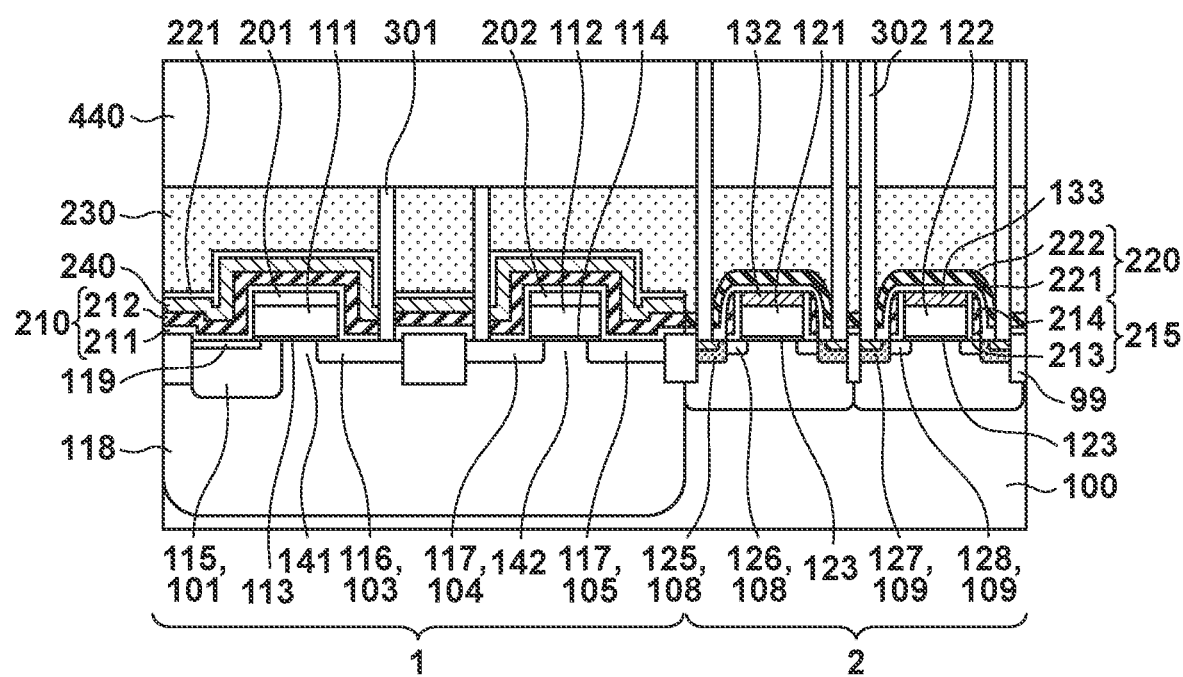

Then, as shown in FIG. 6C, in the peripheral circuit region 2, holes are formed in the insulating film 230 by anisotropic dry etching by using a mask pattern 440 covering the insulating film 230 and having openings in regions for forming contact holes 302 and 304. Consequently, the contact holes 302 and 304 for forming conductive members 312 and 314 are formed. When forming the contact hole 302, the silicon nitride layer 222 of the insulating film 220 can be used as an etching stopper in the peripheral circuit region 2. The contact holes 302 and 304 are formed to extend through the insulating film 230, silicon nitride layer 222, and silicon oxide layer 221. The contact hole 302 exposes the silicide layers 134 and 135 positioned in the regions 108 and 109 serving as the source-drain regions of the peripheral transistors. In parallel with the formation of the contact hole 302, the contact hole 304 which forms the conductive member 314 and exposes the silicide layers 132 and 133 of the gate electrodes 121 and 122 is formed.

After the contact holes 301, 302, 303, and 304 are formed, the conductive members 311, 312, 313, and 314 which function as contact plugs are formed by filling a conductor such as a metal in the contact holes 301, 302, 303, and 304. These conductive members can be filled in the contact holes 301, 302, 303, and 304 at once.

The step of forming the contact holes 301 and 303 in the pixel region 1 and filling the conductive members 311 and 313 and the step of forming the contact holes 302 and 304 in the peripheral circuit region 2 and filling the conductive members 312 and 314 may also be different steps. By using different contact plug formation steps in the pixel region 1 and peripheral circuit region 2, it is possible to suppress the metal contained in the silicide layers 132, 133, 134, and 135 from contaminating the impurity regions in the pixel region 1 via the contact holes 301 and 303. The step of forming the contact holes and forming the contact plugs by filling the conductive members can be performed first in either of the pixel region 1 or peripheral circuit region 2.

The structure shown in FIGS. 2A and 2B is obtained by the above-described steps. After that, the imaging apparatus 1000 is completed by forming wiring patterns, color filters, microlenses, and the like. A hydrogen annealing process for promoting hydrogen supply to the pixel transistors and peripheral transistors can also be added in a state in which the peripheral transistors are covered with the insulating film 220. The hydrogen annealing process means a process of performing hydrogen termination on the surface of the substrate 100 by heating the substrate 100 in a hydrogen atmosphere. The hydrogen annealing process may also be performed after wiring patterns are formed after the formation of the conductive members 311, 312, 313, and 314.

The first embodiment according to the present invention has been explained above, but the present invention is, of course, not limited to the first embodiment, and appropriate changes and combinations can be made on the above-described first embodiment without departing from the spirit and scope of the invention. For example, in the above first embodiment, the present invention has been explained by taking an imaging apparatus of semiconductor apparatuses as an example. However, the present invention is not limited to an imaging apparatus and is applicable to any semiconductor apparatus including insulating gate type field-effect transistors, such as an arithmetic operation apparatus, storage apparatus, control apparatus, signal processing apparatus, detection apparatus, and display apparatus.

A device incorporating the imaging apparatus 1000 will be explained below as an application example of the imaging apparatus according to the first embodiment described above. The concept of the device includes not only an electronic device such as a camera whose main purpose is imaging, but also a device which includes an imaging function as an auxiliary function, for example, a personal computer, an electronic device such as a portable terminal, and a transportation device such as an automobile, ship, or airplane. When using the imaging apparatus 1000 according to the embodiment of the present invention in a transportation device, it is possible to reduce changes in characteristics against intense light such as sunlight. Accordingly, when designing, manufacturing, and selling a transportation device, the use of the imaging apparatus according to the embodiment of the present invention is effective in increasing the value of the transportation device. A device incorporating the imaging apparatus 1000 includes the imaging apparatus 1000 according to the present invention exemplified as the above-mentioned first embodiment, and a processing unit for processing information based on signals output from the imaging apparatus 1000. This processing unit can include a processor for processing digital data as image data. The processor can calculate a defocus amount based on signals from pixels having a focus detecting function of the imaging apparatus 1000, and perform a process of controlling the focusing of an imaging lens based on a calculation result. An A/D converter for generating the abovementioned image data can be mounted on the substrate 100. It is also possible to stack a substrate including the A/D converter on the substrate 100 and use this stack as the imaging apparatus 1000, or form the A/D converter independently of the imaging apparatus 1000. In a device incorporating the imaging apparatus 1000, data obtained from the imaging apparatus 1000 can be displayed on a display apparatus of the device or stored in a storage apparatus of the device. In addition, in the device incorporating the imaging apparatus 1000, a mechanical apparatus such as a motor of the device can be driven based on data obtained from the imaging apparatus 1000.

Figure 8:
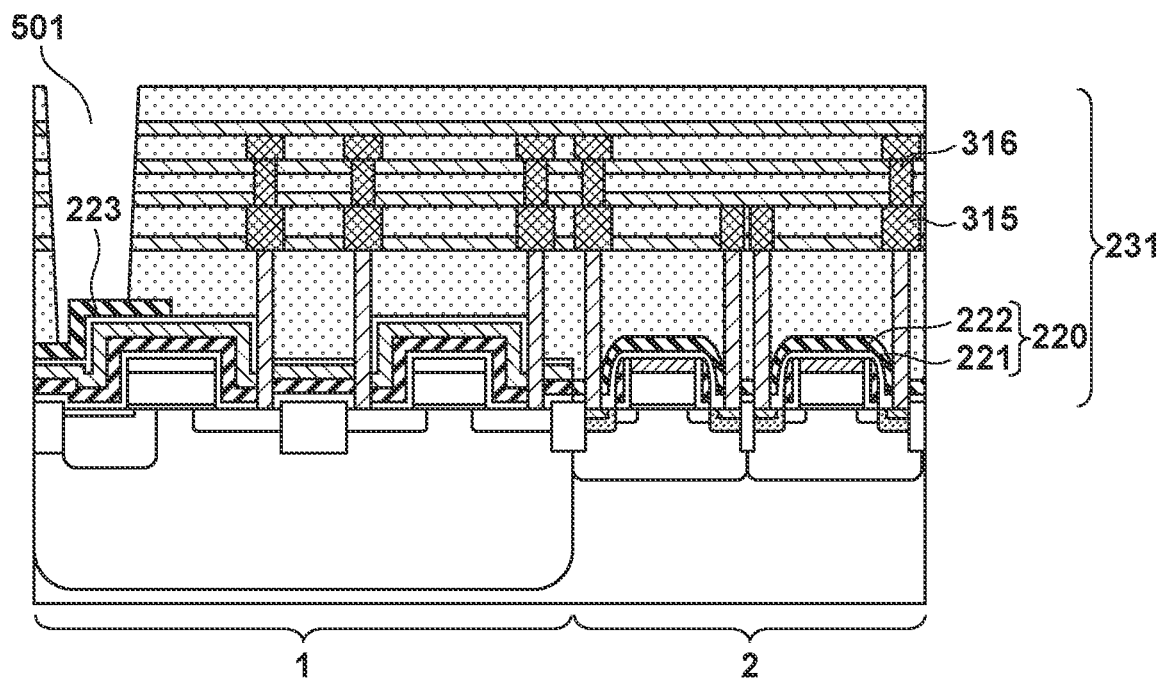
FIG. 8 is a sectional view of an imaging apparatus of the second embodiment.

A manufacturing method of the second embodiment of the present invention will be explained below with reference to FIG. 8. The second embodiment is different from the first embodiment in that a waveguide is used to increase the amount of light entering a photoelectric conversion portion 11, and is the same as the first embodiment in other respects. In the second embodiment, a silicon nitride layer 222 is left behind on the photoelectric conversion portion 11, and a silicon nitride layer 223 is used as an etching stop film for forming the waveguide.

After the formation of an insulating film 220, a mask pattern is formed by using a photoresist or the like so as to cover that portion of the insulating film 220, which is positioned above a portion of a pixel region 1, and that portion of the insulating film 220, which is positioned above a peripheral circuit region 2. Then, that portion of a silicon nitride layer 212, which is positioned above the pixel region 1, is etched away through an opening of the mask pattern. Consequently, the silicon nitride layer 223 is formed to be positioned above at least the photoelectric conversion portion 11 in the pixel region 1.

Then, a plurality of interlayer dielectric films 231, contact plugs, a first interconnection layer 315, and a second interconnection layer 316 including a via plug are formed. The plurality of interlayer dielectric films 231 are formed by alternately stacking silicon oxide layers and silicon nitride layers. The plurality of interlayer dielectric films 231 can be used as a clad of the waveguide. The first and second interconnection layers 315 and 316 can be formed by a damascene method by using a material containing copper as a main component, but may also be formed by using another material such as aluminum.

Subsequently, an opening 501 is formed in the plurality of interlayer dielectric films 231. For example, the opening 501 is formed by forming a mask pattern having an opening in a region corresponding the photoelectric conversion portion 11 on the plurality of interlayer dielectric films 231, and etching the plurality of interlayer dielectric films 231 by using the mask pattern as a mask. This etching is, for example, anisotropic etching. More specifically, plasma etching is performed on the plurality of interlayer dielectric films 231 until the silicon nitride layer 223 is exposed. The silicon nitride layer 223 is a film for reducing plasma damage to the photoelectric conversion portion 11 during etching, and can also function as an etching stop film.

Then, a transparent material having a refractive index higher than that of the plurality of interlayer dielectric films 231 as a clad is filled in the opening 501, thereby forming a portion that is to be the core of the waveguide for guiding light to the photoelectric conversion portion 11. In this embodiment, silicon nitride having a refractive index higher than that of silicon oxide as a main material of the plurality of interlayer dielectric films 231 is formed in the opening 501, but silicon oxide may also be used. More specifically, silicon nitride is deposited on the entire surface by HDP-CVD (High Density Plasma-CVD), thereby filling silicon nitride in the opening 501. Silicon nitride formed in portions other than the opening 501 can be removed by, for example, CMP (Chemical Mechanical Polishing) or plasma etching. After that, the imaging apparatus is completed by forming wiring patterns, color filters, microlenses, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-188985, filed Sep. 28, 2017, which is hereby incorporated by reference herein in its entirety.

What is claimed is:

1. An imaging apparatus comprising:
    a substrate including a photoelectric conversion portion; and
    a silicon nitride layer arranged to cover at least a portion of the photoelectric conversion portion,
    wherein the silicon nitride layer contains chlorine, and
    wherein an N/Si composition ratio in the silicon nitride layer is from 1.00 to less than 1.33.

2. The apparatus according to claim 1, wherein:
    the silicon nitride layer contains silicon, nitrogen, hydrogen, and chlorine; and,
    a composition ratio of chlorine in the silicon nitride layer is lower than a composition ratio of each of silicon, nitrogen, and hydrogen.

3. The apparatus according to claim 2, further comprising a gate electrode of a transistor for transferring a charge stored in the photoelectric conversion portion,
    wherein a distance between a portion of the silicon nitride layer above the photoelectric conversion portion, and a surface of the substrate is shorter than a distance between an upper surface of the gate electrode and the surface of the substrate.

4. The apparatus according to claim 3, wherein the silicon nitride layer further covers the upper surface and a side surface of the gate electrode.

5. The apparatus according to claim 2, wherein a chlorine concentration in the silicon nitride layer is not less than 0.3 atomic %.

6. The apparatus according to claim 2, wherein a chlorine concentration in the silicon nitride layer is not more than 6 atomic %.

7. The apparatus according to claim 2, further comprising a silicon oxide layer arranged in contact with the silicon nitride layer and between the photoelectric conversion portion and the silicon nitride layer,
    wherein a thickness of the silicon nitride layer is not less than a thickness of the silicon oxide layer.

8. The apparatus according to claim 2, wherein the silicon nitride layer functions as an antireflection layer.

9. The apparatus according to claim 1, wherein the substrate includes an amplification element, and the silicon nitride layer extends from a portion above the photoelectric conversion portion to a portion above the amplification element.

10. The apparatus according to claim 9, wherein:
    the silicon nitride layer contains silicon, nitrogen, hydrogen, and chlorine; and
    a composition ratio of chlorine in the silicon nitride layer is lower than a composition ratio of each of silicon, nitrogen, and hydrogen.

11. A device comprising:
    the imaging apparatus cited in claim 1; and
    a processor configured to process a signal output from the imaging apparatus.

12. A method of manufacturing an imaging apparatus, comprising:
    forming a photoelectric conversion portion in a substrate; and
    forming a silicon nitride layer covering at least a portion of the photoelectric conversion portion by using chemical vapor deposition,
    wherein the silicon nitride layer contains chlorine, and
    an N/Si composition ratio in the silicon nitride layer is from 1.00 to less than 1.33.

13. The method according to claim 12, wherein the silicon nitride layer is formed by using a process gas containing hexachlorodisilane.

14. The method according to claim 13, wherein:
    the process gas further contains ammonia; and an ammonia/hexachlorodisilane ratio in the process gas is from 60 to less than 120.

15. A method of manufacturing an imaging apparatus, comprising:
forming a photoelectric conversion portion in a substrate; and
forming a silicon nitride layer covering at least a portion of the photoelectric conversion portion,
wherein the silicon nitride layer is formed by using a process gas containing hexachlorodisilane and ammonia, and
wherein an ammonia/hexachlorodisilane ratio in the process gas is from 60 to less than 120.

16. The method according to claim 12, wherein:
the silicon nitride layer contains silicon, nitrogen, hydrogen, and chlorine; and
a composition ratio of chlorine in the silicon nitride layer is lower than a composition ratio of each of silicon, nitrogen, and hydrogen.

17. The method according to claim 16, wherein a chlorine concentration in the silicon nitride layer is from 0.3 atomic % to 6 atomic %.

18. The method according to claim 17, further comprising forming a silicon oxide layer,
wherein the silicon oxide layer is arranged in contact with the silicon nitride layer and between the photoelectric conversion portion and the silicon nitride layer, and
wherein a thickness of the silicon nitride layer is not less than a thickness of the silicon oxide layer.

19. The apparatus according to claim 1, wherein the substrate includes a transistor with a silicide layer, and wherein the silicide layer contains nickel or cobalt.

20. The apparatus according to claim 19, wherein the silicide layer is absent between the silicon nitride layer and a silicon layer of the substrate.

* * * * *